United States Patent
Sun et al.

(10) Patent No.: US 7,554,810 B1
(45) Date of Patent: Jun. 30, 2009

(54) MOUNTING APPARATUS FOR SECURING HEAT DISSIPATION MODULE TO CIRCUIT BOARD

(75) Inventors: Ke Sun, Shenzhen (CN); Zhen-Xing Ye, Shenzhen (CN); Ming-Ke Chen, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 0 days.

(21) Appl. No.: 11/967,109

(22) Filed: Dec. 29, 2007

(30) Foreign Application Priority Data
Dec. 21, 2007 (CN) .................. 2007 1 0203321

(51) Int. Cl.
*H05K 7/20* (2006.01)
*F28F 7/00* (2006.01)
*H01L 23/34* (2006.01)

(52) U.S. Cl. .............. 361/719; 165/80.3; 165/185; 257/719; 361/704; 361/697; 24/457; 24/458; 248/505; 248/510

(58) Field of Classification Search ............. 257/719; 361/719
See application file for complete search history.

(56) References Cited

U.S. PATENT DOCUMENTS

| 6,952,348 | B2* | 10/2005 | Wu ........................... 361/719 |
| 7,055,790 | B2* | 6/2006 | Schroeter ................... 248/323 |
| 7,068,514 | B2* | 6/2006 | Chang et al. ............... 361/705 |
| 7,349,210 | B2* | 3/2008 | Sheng et al. ............... 361/695 |
| 7,365,983 | B2* | 4/2008 | Huang et al. .............. 361/704 |
| 2006/0042787 | A1* | 3/2006 | Yu et al. ..................... 165/185 |

* cited by examiner

*Primary Examiner*—Gregory D Thompson
(74) *Attorney, Agent, or Firm*—Frank R. Niranjan (57) ABSTRACT

A heat dissipating apparatus includes a plurality of posts for being detachably attached to a circuit board adjacent a socket mounted thereon, a mounting frame for being attached to the heat dissipation module, and a plurality of support devices. Each support device comprises an enlarged flange portion, a support portion extending up from an upper surface of the flange portion, and a coupling portion extending down from a lower surface of the flange portion and detachably installable to a corresponding post, thereby suspending the heat dissipation module over the socket. A plurality of sleeve bodies is for respectively receiving the posts, and configured for being sandwiched between the corresponding flange portions and the circuit board. A plurality of fasteners extending from the mounting frame is engagable with the support portions respectively.

9 Claims, 7 Drawing Sheets

MOUNTING APPARATUS FOR SECURING HEAT DISSIPATION MODULE TO CIRCUIT BOARD

BACKGROUND

1. Field of the Invention

The present invention relates to mounting apparatuses, and more particularly to a mounting apparatus for securing a heat dissipation module to a circuit board and allowing the heat dissipation module and the circuit board being packed together during transportation.

2. Description of Related Art

Figure 6:
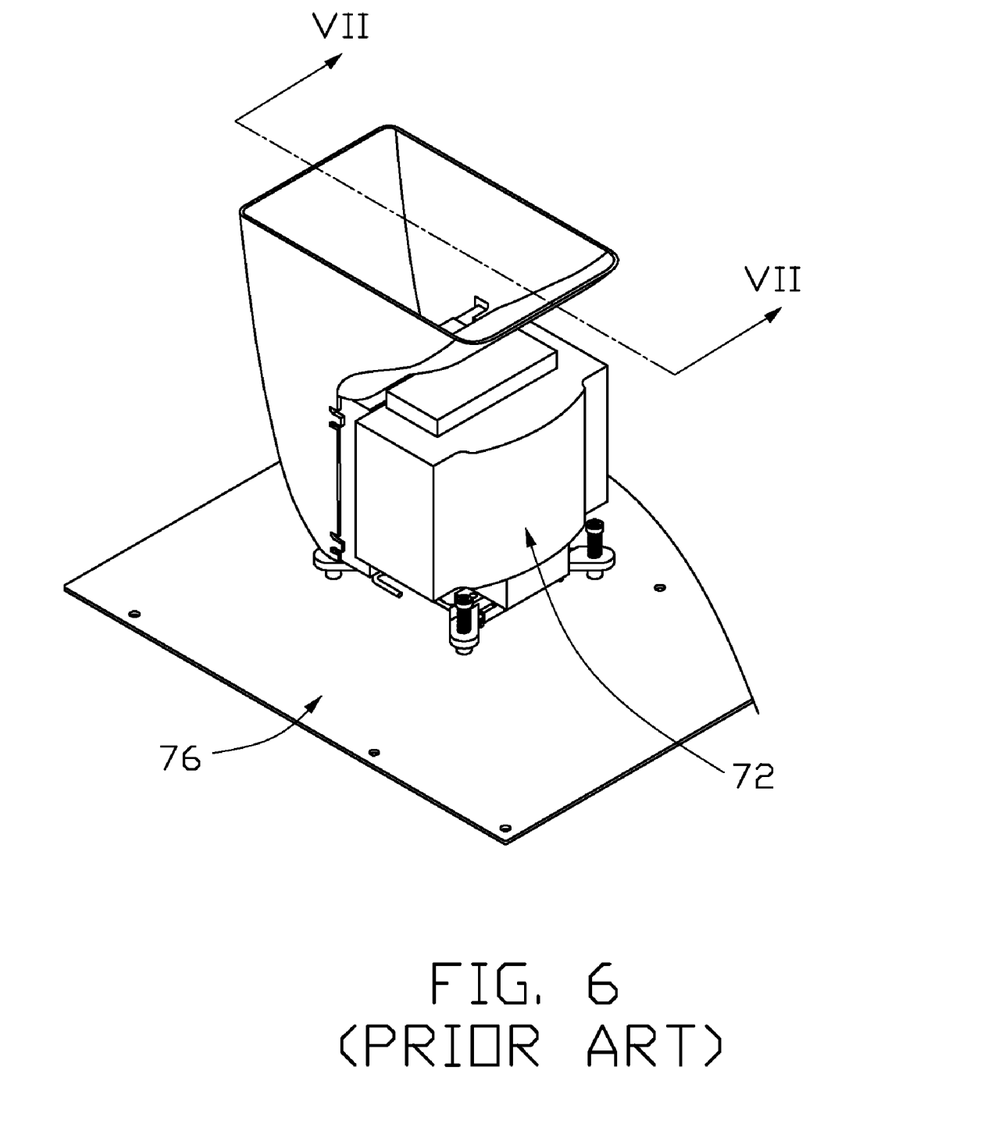
FIG. 6 is an assembled, isometric view of a typical mounting apparatus, together with a heat dissipation module and a circuit board.
Figure 7:
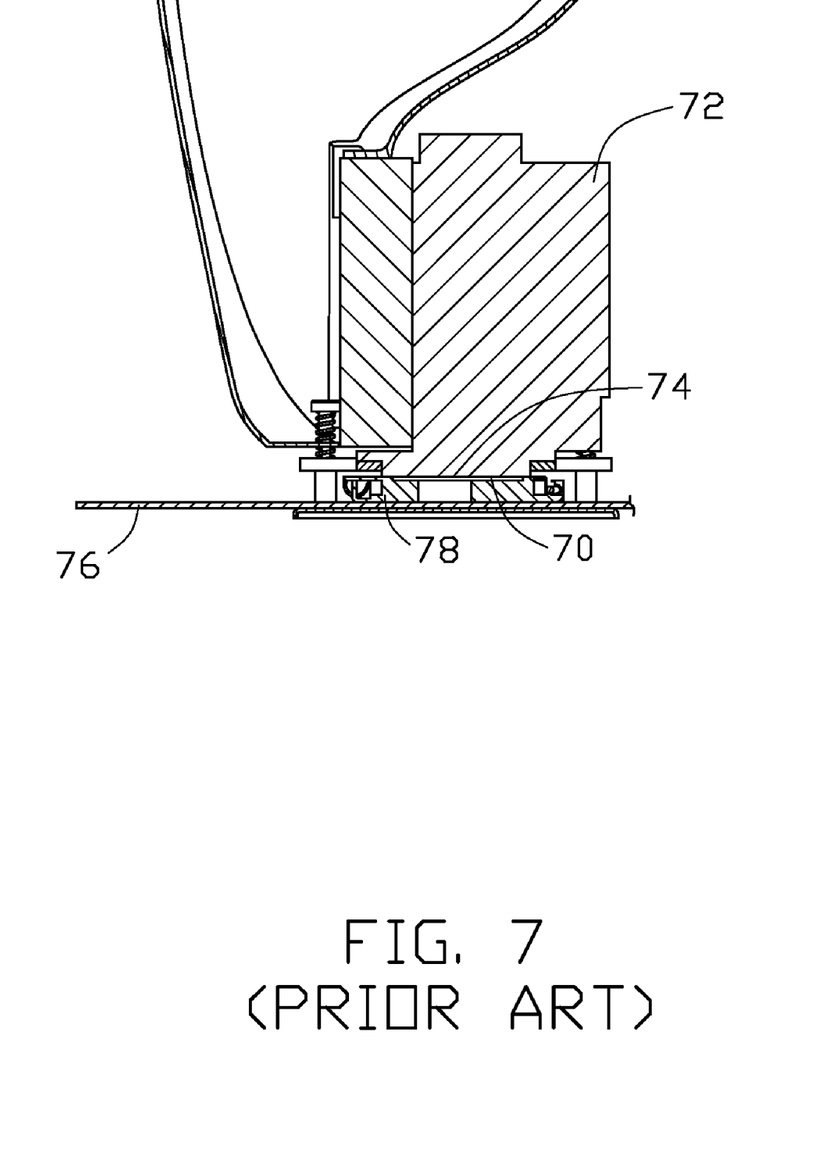
FIG. 7 is a cross-sectional view of FIG. 6 taken along line VII-VII.

In computer systems, certain electronic components such as central processing units (CPUs) generate large amounts of heat during their normal operation. The heat must be quickly removed to prevent the CPUs from becoming overheated and damaged. Referring to FIGS. 6 and 7, a thermal module 72 is attached to a CPU 70 superimposed on a socket 78 of a circuit board 76 to facilitate dissipation of heat generated by the CPU 70. A thermal interface material such as a layer of thermal grease 74 is evenly spread on a bottom of the thermal module 72 and adjoins a top surface of the CPU 70 to create a low resistance thermal path for dissipation of heat.

However, when computer systems are transported by original equipment manufacturers (OEMs) to their customers, thermal modules and circuit boards are typically separately packed and transported to customers because there are protective covers covering the thermal grease spread on the thermal modules and the sockets on the circuit boards which prevent the thermal modules from being attached to the circuit boards. Therefore, packing and transportation costs for the thermal modules and the circuit boards are high.

What is desired, therefore, is a mounting apparatus which firmly secures a thermal module to a circuit board and allows the thermal module and the circuit board being packed together during transportation.

SUMMARY

An exemplary mounting apparatus is provided for securing a heat dissipation module to a circuit board with a socket mounted thereon. The socket is adapted for receiving a heat-generating component. The mounting apparatus comprises a plurality of posts for being detachably attached to the circuit board adjacent the socket, a mounting frame for being attached to the heat dissipation module, a plurality of support devices, and a plurality of sleeve bodies. A plurality of hollow poles extends down from a lower surface of the mounting frame. Each of the support devices comprises an enlarged flange portion supporting a corresponding pole thereon, a support portion extending up from an upper surface of the flange portion and being received in the pole, and a coupling portion extending down from a lower surface of the flange portion and detachably installable to a corresponding post, thereby suspending the heat dissipation module over the socket. The sleeve bodies are for respectively receiving the posts, and configured for being sandwiched between the corresponding flange portions and the circuit board. A plurality of fasteners extending from the mounting frame is engagable with the support portions respectively.

Other advantages and novel features of the present invention will become more apparent from the following detailed description of an embodiment when taken in conjunction with the accompanying drawings, in which:

DETAILED DESCRIPTION

Figure 1:
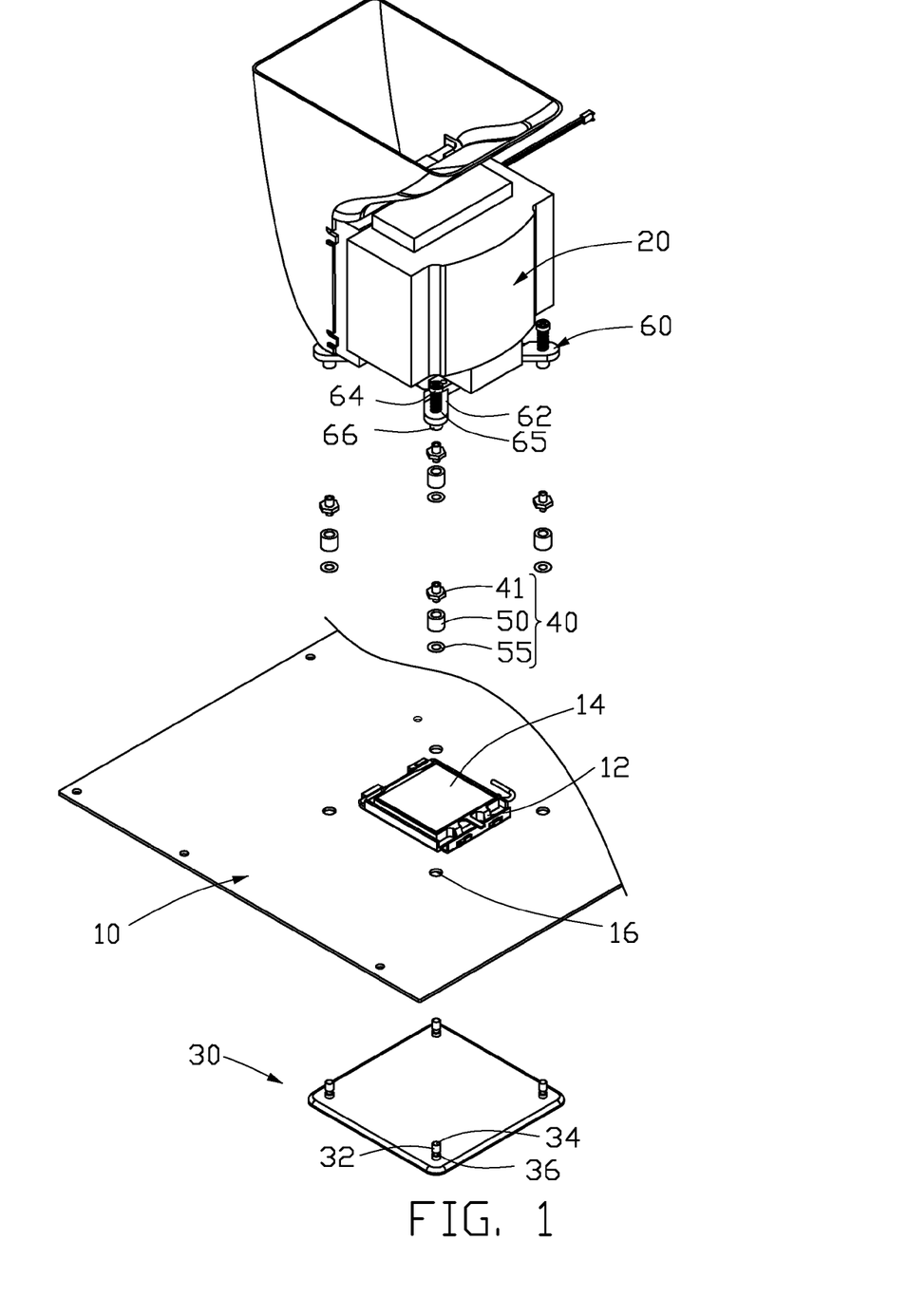
FIG. 1 is an exploded, isometric view of a mounting apparatus for securing a heat dissipation module to a circuit board according to an embodiment.
Figure 5:
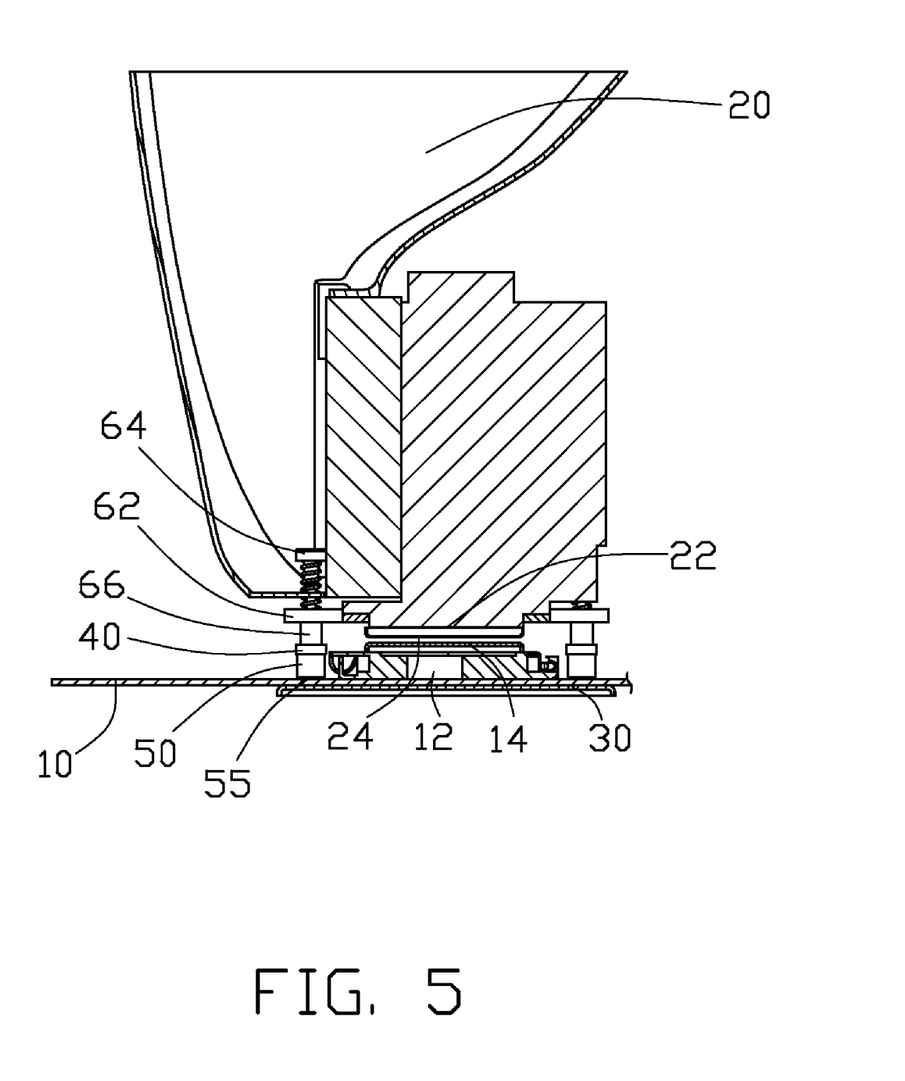
FIG. 5 is a cross-sectional view of FIG. 4 taken along line V-V.

Referring to FIGS. 1 and 5, in an embodiment, a mounting apparatus is provided for securing a heat dissipation module 20 to a circuit board 10. A socket 12 for receiving a computer chip such as a central processing unit (CPU) is attached to a top surface of the circuit board 10. A shielding lid 14 is covered onto the socket 12. A plurality of bores 16 is defined in the circuit board 10 surrounding the socket 12. A thermal adhesive 22 such as a layer of thermal grease is spread on a bottom of the heat dissipation module 20 to create a low resistance thermal path between the computer chip and the bottom of the heat dissipation module 20. A protective cover 24 is mounted at the bottom of the heat dissipation module 20 to cover the thermal adhesive 22 and protect the thermal adhesive 22 from dust and possible damage.

In the embodiment, the mounting apparatus includes a bolster plate 30 attached to a bottom surface of the circuit board 30, a plurality of support devices 40, and a mounting frame 60 fixed at the bottom of the heat dissipation module 20. A plurality of posts 32 projects upwardly from a top surface of the bolster plate 30 respectively adjacent four corners thereof, corresponding to the bores 16 of the circuit board 10. A threaded hole 34 is defined in each post 32 at a free end thereof, and an encircling mounting groove 36 is defined adjacent a bottom of each post 32.

Figure 2:
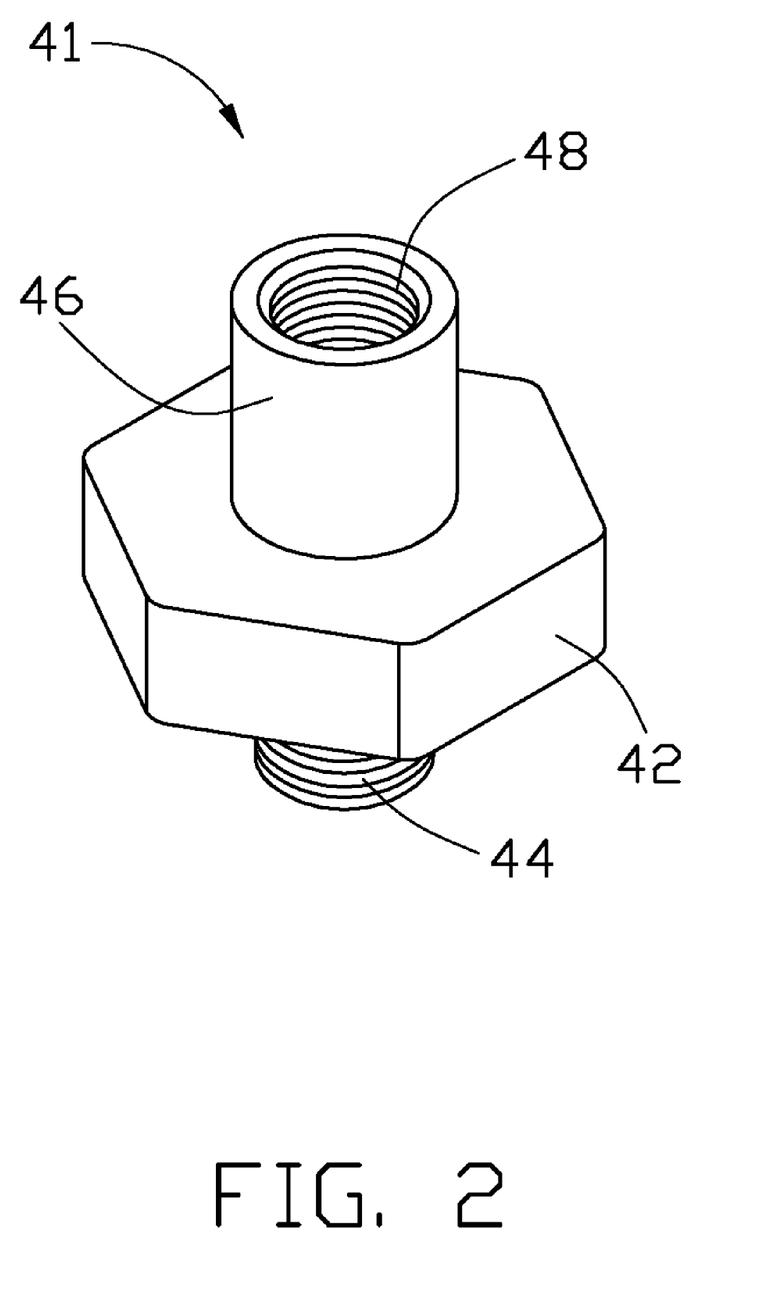
FIG. 2 is an enlarged view of a connecting member of one support device of FIG. 1.
Figure 3:
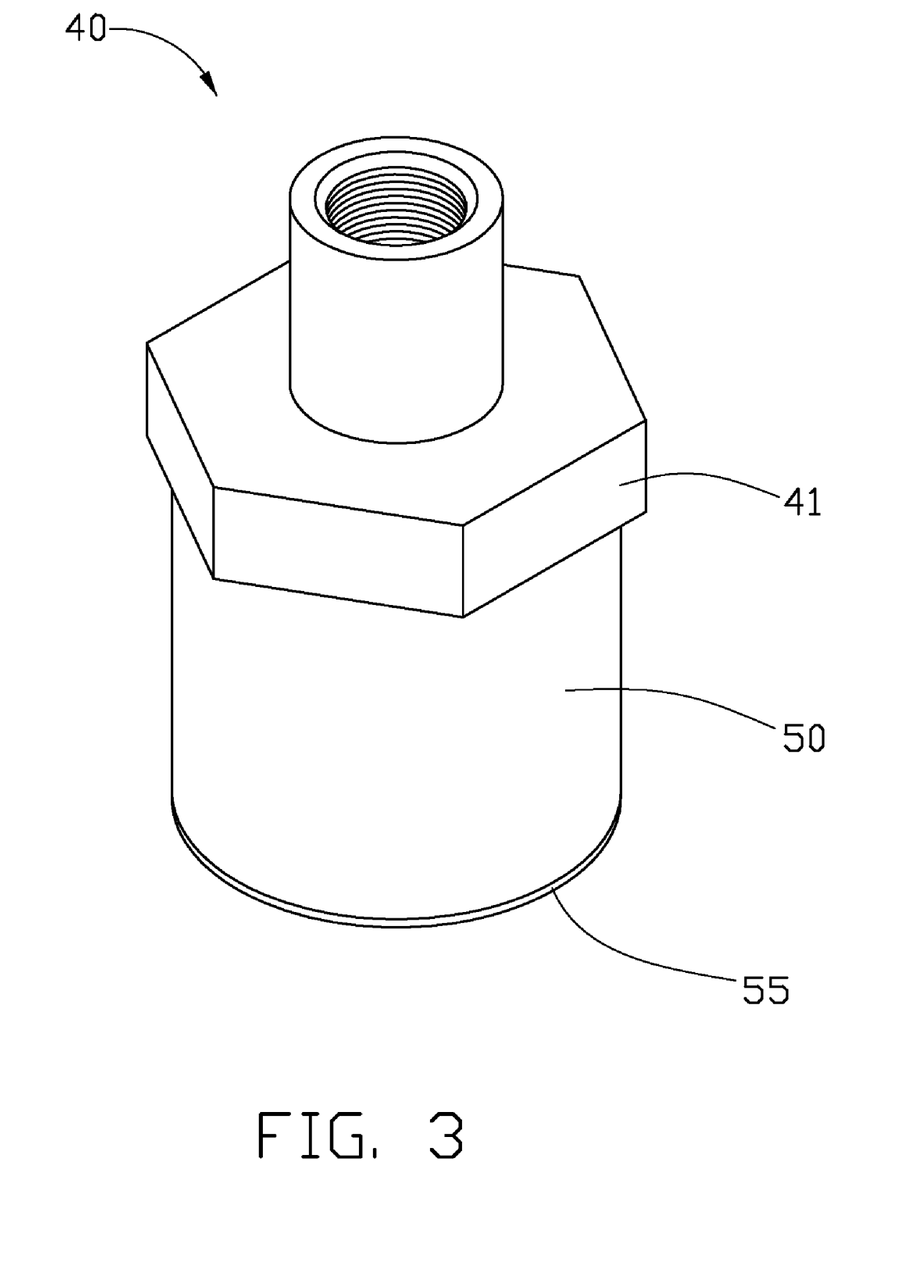
FIG. 3 is an assembled view of one support device of FIG. 1.

Referring also to FIG. 2, each support device 40 includes a connecting member 41, a sleeve body 50, and a washer 55. The connecting member 41 includes a flange portion 42, and a coupling portion such as a threaded portion 44 and a support portion 46 respectively extending down from a lower surface and up from an upper surface of the flange portion 42. The flange portion 42 has a polygonal shape such as a hexagon shape to facilitate manipulation of the connecting member 41. A fixing opening such as a threaded opening 48 is defined in the support portion 46 at a top thereof. In this embodiment, the sleeve bodies 50 and washers 55 of the support devices are made of Mylar.

A plurality of support legs 62 extends from the mounting frame 60. A fastener, such as a screw 64, is provided for extending through each support leg 62. A coil spring 65 is attached around the fastener 64 and compressed between a head of the fastener 64 and the corresponding support leg 62. A hollow pole 66 extends down from a lower surface of the support leg 62, allowing the corresponding fastener 64 extending therethrough.

Referring to FIGS. 1 to 5, in assembly, the posts 32 of the bolster plate 30 are respectively inserted through the bores 16 of the circuit board 10, the bolster plate 30 abuts against the bottom surface of the circuit board 10 and the posts 32 extend out from the top surface of the circuit board 10. The mounting grooves 36 of the posts 32 are generally positioned over the top surface of the circuit board 10. A plurality of hollow rubber bushings (not shown) is respectively assembled to the posts 32 by snappingly fitting in the mounting grooves 36 thereof, a periphery of each rubber bushing abuts against the top surface of the circuit board 10 thereby securing the bolster plate 30 to the circuit board 10.

The sleeve bodies 50 are glued to the lower surfaces of the flange portion 42 of the corresponding connecting member 41, and the threaded portions 44 thereof are received in the corresponding sleeve bodies 50. The washers 55 are glued to free ends of the corresponding sleeve bodies 50, thereby the support devices 40 are assembled. The threaded portions 44 of the support devices 40 are screwed into the threaded holes 34 of the posts 32, and the posts 32 are received in the corresponding sleeve bodies 50 thereof. The washers 55 of the support devices 40 are sandwiched between the top surface of the circuit board 10 and the corresponding free ends of the sleeve bodies 50.

The combined heat dissipation module 20 and mounting frame 60 are disposed on the circuit board 10, the support portions 46 of the support devices 40 are respectively received in the hollow poles 66 of the mounting frame 60, and free ends of the hollow poles 66 respectively engage with the upper surfaces of the corresponding flange portions 42 of the support devices 50. The screws 64 of the mounting frame 60 are extended through the corresponding hollow poles 66 and respectively screwed into the threaded openings 48 of the corresponding support portions 46, thereby securing the heat dissipation module 20 to the circuit board 10. The heat dissipation module 20 is supported over the socket 12, thereby leaving a space between the shielding lid 14 covering the socket 12 and the protective cover 24 covering the bottom of the heat dissipation module 20.

Figure 4:
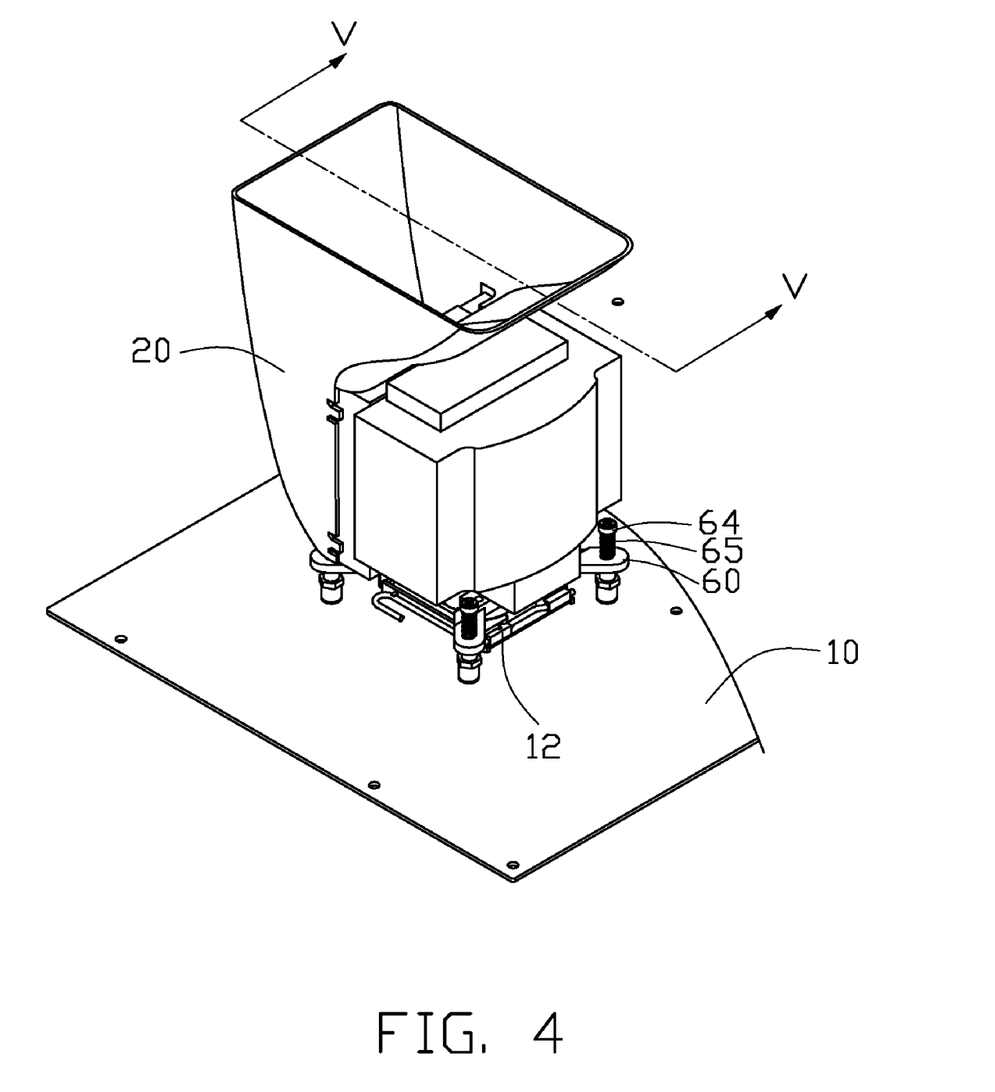
FIG. 4 is an assembled view of FIG. 1.

Once the circuit board 10 combined with the heat dissipation module 20 is received by a customer, the fasteners 64 of the mounting frame 60 are respectively unscrewed from the corresponding threaded openings 48 of the support devices 40, and the heat dissipation module 20 is detached from the circuit board 10. The threaded portions 44 of the support devices 40 are unscrewed from the corresponding threaded holes 34 of the posts 32 of the bolster plate 30, and the support devices 40 are detached from the posts 32 respectively. The shielding lid 14 is removed from the socket 12, and a computer chip is installed in the socket 12. The protective cover 24 is removed from the bottom of the heat dissipation module 20, and the heat dissipation module 20 combined with the mounting frame 60 is disposed on the circuit board 10, the posts 32 of the bolster plate 30 are respectively received in the hollow poles 66 of the mounting frame 60, and the free ends of the hollow poles 66 respectively engage the top surface of the circuit board 10. The screws 64 are respectively screwed into the corresponding threaded holes 34 of the posts 32, thereby securing the heat dissipation module 20 to the circuit board 10.

The mounting apparatus of the present invention allows for two mounting positions, one of which ensures safe shipping not only by providing a space between surfaces needing protection, but also by reinforcing the posts 32 of the bolster plate 30 because of the arrangement of the sleeve bodies 50 between the flange portions of the support devices 40 and the top surface of the circuit board 10, and the other which allows customer to secure the heat dissipation module 20 to the circuit board 10 via the screws 64 engaging with the posts 32 directly after the support devices 40, the shielding lid 14, the protective cover 24 are removed, and contacting the thermal adhesive 22 spread on the bottom of the heat dissipation module 20 with a top surface of the computer chip.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for securing a heat dissipation module to a circuit board with a socket mounted thereon, the socket adapted for receiving a heat-generating component therein, the mounting apparatus comprising:
    a plurality of posts adapted for being detachably attached to the circuit board adjacent the socket;
    a mounting frame adapted for attachment to the heat dissipation module, a plurality of hollow poles extending down from a lower surface of the mounting frame;
    a plurality of support devices each comprising an enlarged flange portion supporting a corresponding one of the plurality of poles, a support portion extending up from an upper surface of the flange portion and being received in the corresponding pole, and a coupling portion extending down from a lower surface of the flange portion and detachably installable to a corresponding post, thereby suspending the heat dissipation module over the socket;
    a plurality of sleeve bodies, each sleeve body for respectively receiving the a corresponding post, and configured for being sandwiched between the corresponding flange portions and the circuit board; and
    a plurality of fasteners, each fastener extending from the mounting frame and engagable with a corresponding support portion.

2. The mounting apparatus as described in claim 1, wherein the flange portion of each of the support devices has a polygonal shape.

3. The mounting apparatus as described in claim 1, wherein a threaded hole is defined in each of the posts, and each of the coupling portions of the support devices has male threads formed therearound for engaging with the threaded hole of a corresponding post to provide the detachable installation.

4. The mounting apparatus as described in claim 1, wherein a fixing opening is defined in each of the support portions of the support devices, and the fasteners are received in the fixing openings of the support portions respectively.

5. The mounting apparatus as described in claim 1, wherein a plurality of washers is respectively located at free ends of the sleeve bodies.

6. A combination comprising:
    a circuit board with a socket mounted thereon, the socket being configured for receiving an electronic component therein;
    a plurality of posts attached to the circuit board adjacent the socket;
    a heat dissipation module with thermal grease mounted on a bottom surface thereof, a protective cover attached on the bottom surface to cover the thermal grease;

a mounting frame attached to the heat dissipation module, a plurality of hollow poles extending down from a lower surface of the mounting frame; and a plurality of support devices detachably installable to the corresponding posts, each of the support devices comprising an enlarged flange portion supporting a corresponding pole thereon, a support portion extending up from an upper surface of the flange portion and being received in the corresponding pole, and a sleeve body sandwiched between the flange portion and the circuit board for receiving a corresponding post, together suspending the heat dissipation module over the socket to prevent the protective cover from interfering with the socket;

wherein a plurality of fasteners extend from the mounting frame and each fastener is engagable with a corresponding support portion of a connecting member.

7. The combination as described in claim 6, wherein when the support devices and the protective cover are removed away and the electronic component is mounted on the socket, the fasteners are engagable with the posts respectively to thereby secure the heat dissipation module to the electronic component.

8. The combination as described in claim 7, wherein each of the posts defines a threaded hole, and a threaded portion extends from a lower surface of the flange portion of each of the support devices and being screwed into a corresponding threaded hole to provide the detachable installation.

9. The combination as described in claim 6, further comprising a plurality of washers, wherein each washer is sandwiched between one of the free ends of the sleeve bodies and the circuit board.

* * * * *